US009753468B2

(12) United States Patent
Kimura

(10) Patent No.: US 9,753,468 B2
(45) Date of Patent: Sep. 5, 2017

(54) ELECTRONIC CIRCUIT, POWER SUPPLY CIRCUIT, METHOD OF MEASURING CIRCUIT CHARACTERISTICS

(71) Applicant: SOCIONEXT INC., Yokohama-shi, Kanagawa (JP)

(72) Inventor: Takeshi Kimura, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 92 days.

(21) Appl. No.: 14/982,928

(22) Filed: Dec. 29, 2015

(65) Prior Publication Data

US 2016/0216720 A1 Jul. 28, 2016

(30) Foreign Application Priority Data

Jan. 26, 2015 (JP) ................. 2015-012420

(51) Int. Cl.
*G05F 1/10* (2006.01)
*G06G 7/163* (2006.01)
*G01R 25/00* (2006.01)

(52) U.S. Cl.
CPC ............... *G05F 1/10* (2013.01); *G06G 7/163* (2013.01); *G01R 25/00* (2013.01)

(58) Field of Classification Search
CPC ............ G05F 1/10; G06G 7/163; G01R 25/00
See application file for complete search history.

(56) References Cited

U.S. PATENT DOCUMENTS

| 8,866,539 B2* | 10/2014 | Sano | G05F 3/30 327/513 |
|---|---|---|---|
| 2009/0220244 A1 | 9/2009 | Nash et al. | |
| 2013/0113450 A1* | 5/2013 | Tang | G05F 1/10 323/283 |
| 2013/0271055 A1* | 10/2013 | Xu | H02P 27/06 318/503 |

FOREIGN PATENT DOCUMENTS

| JP | 10-164164 A | 6/1998 |
|---|---|---|
| JP | 2009-506311 A | 2/2009 |

* cited by examiner

*Primary Examiner* — Jue Zhang
(74) *Attorney, Agent, or Firm* — Arent Fox LLP

(57) ABSTRACT

An electronic circuit includes a circuit to receive an analog input signal responsive to an analog oscillating signal and to generate an analog output signal, AD converters to perform AD-conversion with respect to the analog oscillating signal, the analog input signal, and the analog output signal to generate a digital oscillating signal, a digital input signal, and a digital output signal, at least one first adjustor to adjust a phase of the digital oscillating signal through the Hilbert transform, a second adjustor to adjust a phase of the digital input signal through the Hilbert transform, a third adjustor to adjust a phase of the digital output signal through the Hilbert transform, a first mixer circuit to multiply the output of the first adjustor and the output of the second adjustor, and a second mixer circuit to multiply the output of the first adjustor and the output of the third adjustor.

16 Claims, 6 Drawing Sheets

ELECTRONIC CIRCUIT, POWER SUPPLY CIRCUIT, METHOD OF MEASURING CIRCUIT CHARACTERISTICS

CROSS-REFERENCE TO RELATED APPLICATIONS

The present application is based upon and claims the benefit of priority from the prior Japanese Patent Application No. 2015-012420 filed on Jan. 26, 2015, with the Japanese Patent Office, the entire contents of which are incorporated herein by reference.

FIELD

The disclosures herein relate to an electronic circuit, a power supply circuit, a method of measuring circuit characteristics, and a recording medium having a program stored therein for calculating amplitude and phase characteristics.

BACKGROUND

A circuit unit situated in a feedback path of a negative feedback circuit generally includes circuit elements such as resistors and capacitors to ensure the stability of the negative feedback circuit. Manufacturing those circuit elements like resistors and capacitors by use of semiconductors results in the variation of parameters of these elements being relatively large. In consideration of this, a negative feedback circuit is designed to have a narrow bandwidth in order to ensure stability despite the variation of characteristics of the feedback circuit portion. A narrow bandwidth, however, gives rise to the problem of slow response time, i.e., the problem in that it takes a long time to attain convergence. Use of a narrow bandwidth in a negative feedback circuit for use in a power-supply control IC, for example, results in a large fluctuation in the output voltage occurring in response to a sudden change in the load current.

Even in the case of a relatively large variation being present in the parameters of circuit elements used in the feedback portion, the resistance values and capacitance values may be adjusted by monitoring the loop-gain characteristics, thereby providing desired stability and response speed. Specifically, the adjustment of resistance values and capacitance values is performed while measuring the phase margin and the gain margin by measuring the loop gain. These obtained margins are taken into account to determine the correction values of the resistors and capacitors. In order to measure the loop-gain characteristics, a signal source may be inserted between the output terminal of a circuit to be measured and the input terminal of a circuit in the feedback path to which the output terminal is coupled. A signal applied to the input terminal and a signal appearing at the output terminal are then measured, followed by obtaining the voltage ratio and phase difference between these signals.

Direct conversion may be utilized in order to measure gain characteristics, i.e., to measure the voltage ratio and phase difference between a signal applied to the input terminal and a signal appearing at the output terminal. Direct conversion is a signal processing method that is typically utilized in high-frequency wireless communication (e.g., in the range of a few hundred MHz to a few GHz or more). Multiplication of an input signal by a local oscillating signal having the same frequency as the input signal serves to convert the input signal directly into a baseband signal. Direct conversion uses an analog circuit to implement an AFE (i.e., analog front-end), a mixer circuit, and a low-pass filter for extracting a baseband signal. This is because converting a high-speed signal with high precision by use of an AD converter is a difficult task.

Implementing an AFE, a mixer circuit and a low-pass filter by use of analog circuits presents a difficult design challenge, and the circuit characteristics tend to vary in response to temperature changes and due to deterioration with time. Variation of the characteristics of these analog circuits between signal paths serves to deteriorate the accuracy of measurements. Further, there is another problem with direct conversion in which the phase of a local oscillating signal is supposed to be displaced by 90 degrees. Namely, it is difficult to provide a 90-degree phase displacement with high accuracy by means of analog processing with respect to various frequencies.

[Patent Document 1] Japanese Laid-open Patent Publication No. H10-164164
[Patent Document 2] Japanese National Publication of International Patent Application No. 2009-506311

SUMMARY

According to an aspect of the embodiment, an electronic circuit includes a first circuit configured to receive an analog input signal responsive to an analog oscillating signal having a desired frequency and generate an analog output signal, AD converters configured to perform AD conversion with respect to the analog oscillating signal, the analog input signal, and the analog output signal to generate a digital oscillating signal, a digital input signal, and a digital output signal, at least one first phase adjustor configured to adjust a phase of the digital oscillating signal through the Hilbert transform to produce an output, a second phase adjustor configured to adjust a phase of the digital input signal through the Hilbert transform to produce an output, a third phase adjustor configured to adjust a phase of the digital output signal through the Hilbert transform to produce an output, a first mixer circuit configured to multiply the output of the first phase adjustor and the output of the second phase adjustor, and a second mixer circuit configured to multiply the output of the first phase adjustor and the output of the third phase adjustor.

According to an aspect of the embodiment, a power supply circuit includes a reference voltage generator circuit configured to output a constant voltage, an amplifier configured to generate a power supply voltage in response to the constant voltage, a feedback circuit configured to supply a negative feedback signal to an input of the amplifier, AD converters configured to perform AD conversion with respect to a first analog signal, a second analog signal, and a third analog signal to output a first digital signal, a second digital signal, and a third digital signal, respectively, and an arithmetic unit configured to adjust characteristics of the feedback circuit in response to the outputs of the AD converters, wherein the arithmetic unit includes a first phase adjustor configured to adjust a phase of the first digital signal through the Hilbert transform to produce an output, a second phase adjustor configured to adjust a phase of the second digital signal through the Hilbert transform to produce an output, a third phase adjustor configured to adjust a phase of the third digital signal through the Hilbert transform to produce an output, a first mixer circuit configured to multiply the output of the first phase adjustor and the output of the second phase adjustor, and a second mixer circuit configured to multiply the output of the first phase adjustor and the output of the third phase adjustor, wherein adjustment is variably made to characteristics of the feedback circuit in response to an output of the first mixer circuit and an output of the second mixer circuit.

According to an aspect of the embodiment, a method of measuring characteristics of a circuit includes applying an analog input signal responsive to an analog oscillating signal having a desired frequency to a circuit to cause the circuit to output an analog output signal, performing AD conversion with respect to the analog oscillating signal, the analog input signal, and the analog output signal to generate a digital oscillating signal, a digital input signal, and a digital output signal, adjusting a phase of the digital oscillating signal through the Hilbert transform, adjusting a phase of the digital input signal through the Hilbert transform, adjusting a phase of the digital output signal through the Hilbert transform, multiplying the phase-adjusted digital oscillating signal and the phase-adjusted digital input signal to generate a first multiplication result, multiplying the phase-adjusted digital oscillating signal and the phase-adjusted digital output signal to generate a second multiplication result, obtaining a ratio between an amplitude of the analog input signal and an amplitude of the analog output signal in response to the first multiplication result and the second multiplication result, and obtaining a difference between a phase of the analog input signal and a phase of the analog output signal in response to the first multiplication result and the second multiplication result.

According to an aspect of the embodiment, a recording medium having a program stored therein for calculating amplitude and phase characteristics is provided, and the program causes an arithmetic apparatus to perform adjusting a phase of a first digital signal through the Hilbert transform, adjusting a phase of a second digital signal through the Hilbert transform, adjusting a phase of a third digital signal through the Hilbert transform, multiplying the phase-adjusted first digital signal and the phase-adjusted second digital signal to generate a first multiplication result, multiplying the phase-adjusted first digital signal and the phase-adjusted third digital signal to generate a second multiplication result, obtaining a ratio between an amplitude of the second digital signal and an amplitude of the third digital signal in response to the first multiplication result and the second multiplication result, and obtaining a difference between a phase of the second digital signal and a phase of the third digital signal in response to the first multiplication result and the second multiplication result, wherein the first digital signal is a digital oscillating signal obtained by AD-converting an analog oscillating signal having a desired frequency, and the second digital signal is a digital input signal obtained by AD-converting an analog input signal responsive to the analog oscillating signal, the analog input signal being input into a circuit, the third digital signal being a digital output signal obtained by AD-converting an analog output signal output by the circuit in response to the analog input signal.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
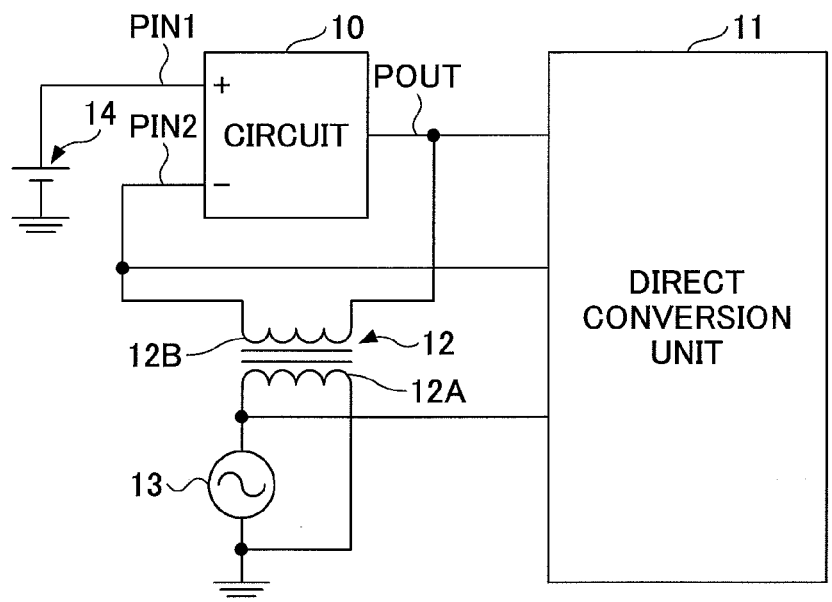
FIG. 1 is a drawing illustrating an example of the configuration of a system that measures the gain characteristics of a circuit to be measured.

FIG. 1 is a drawing illustrating an example of the configuration of a system that measures the gain characteristics of a circuit to be measured. The system illustrated in FIG. 1 includes a circuit 10 to be measured, a direct conversion unit 11, a transducer 12, an oscillating circuit 13 and a constant voltage source 14. This measurement system is used to measure with high precision the gain characteristics between an input signal and an output signal of the circuit 10.

In FIG. 1 and the subsequent drawings, boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

Figure 2:
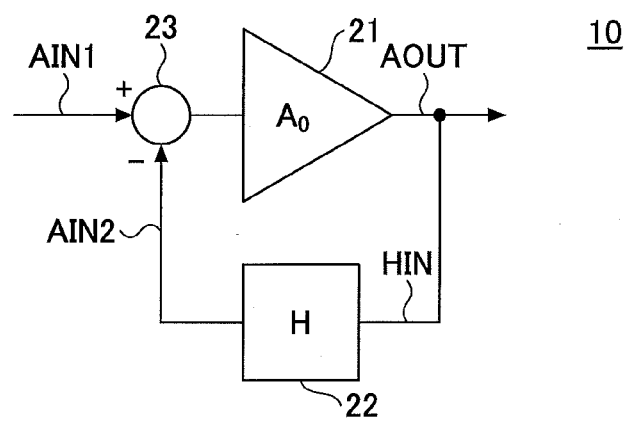
FIG. 2 is a drawing illustrating an example of the configuration of the circuit.

FIG. 2 is a drawing illustrating an example of the configuration of the circuit 10. In this example, the circuit 10 includes an amplifier 21, a feedback circuit 22 and a subtraction circuit 23. The circuit 10 serves as an amplifier circuit to amplify an input signal applied from an external source to a positive input terminal AIN1 of the subtraction circuit 23. A signal output at an output terminal AOUT of the amplifier 21 is applied to an input terminal HIN of the feedback circuit 22. The output of the feedback circuit 22 is applied to a minus input terminal AIN2 of the subtraction circuit 23. The subtraction circuit 23 subtracts the feedback signal of the feedback circuit 22 from the input signal supplied from the external source to supply the signal resulting from the subtraction to the amplifier 21. The gain of the amplifier 21 is $A_0$. The gain of the feedback circuit 22 is H. The loop gain is thus $A_0H$. The characteristics of this loop gain are measured to calculate the gain margin and the phase margin, which are then used to adjust the characteristics of the feedback circuit 22 so as to achieve stability and fast response at the same time.

By referring to FIG. 1 again, the input terminals PIN1 and PIN2 and output terminal POUT of the circuit 10 illustrated in FIG. 1 correspond to the input terminals AIN1 and HIN and the output terminal AOUT illustrated in FIG. 2, respectively. The constant voltage source 14 serves as a reference voltage generating circuit that outputs a constant voltage. The amplifier 21 of the circuit 10 generates an amplified voltage responsive to the constant voltage output by the constant voltage source 14. During a routine operation period different from a characteristic measuring period, the circuit 10 serves as a power supply circuit that generates a desired power supply voltage. In the case of using the circuit 10 as a power supply circuit during the routine operation period, the output terminal POUT of the circuit 10 may directly be coupled to the inverted input terminal PIN2. With this arrangement, the feedback circuit 22 (see FIG. 2) supplies a negative feedback signal to the input of the amplifier 21.

The circuit 10 that is to be measured by the system configuration illustrated in FIG. 1 is not limited to a power supply circuit. In the case of the circuit 10 being not a power supply circuit, the constant voltage source 14 may not be provided. Further, the circuit 10 is not limited to an amplifier circuit including an amplifier. The system configuration illustrated in FIG. 1 can be used to measure the gain characteristics between the input signal and the output signal of the circuit 10 regardless of the intended functions of the circuit 10.

For the purpose of measuring characteristics, a secondary winding 12B is inserted as a signal source between the output terminal POUT (i.e., AOUT in FIG. 2) and the input terminal PIN2 (i.e., the input terminal HIN of the feedback circuit 22 in FIG. 2) of the circuit 10. A primary winding 12A of the transducer 12 is coupled to the oscillating circuit 13. The oscillating circuit 13 may generate a sinusoidal waveform signal whose frequency varies according to the setting. The oscillating circuit 13 generates an analog oscillating signal having a desired frequency, and an analog signal responsive thereto is applied to the circuit 10 through the transducer 12.

The direct conversion unit 11 receives the analog oscillating signal generated by the oscillating circuit 13, the analog input signal applied to the input terminal PIN2 of the circuit 10, and the analog output signal output at the output terminal POUT of the circuit 10. The direct conversion unit 11 performs AD conversion with respect to the analog oscillating signal, the analog input signal, and the analog output signal to generate a digital oscillating signal, a digital input signal, and a digital output signal. The direct conversion unit 11 performs direct conversion by use of these digital signals to obtain the gain characteristics of the circuit 10, i.e., the voltage ratio and phase difference between the input signal and the output signal of the circuit 10.

Specifically, the direct conversion unit 11 is configured to perform the Hilbert transform with respect to the digital oscillating signal to adjust the phase thereof, to perform the Hilbert transform with respect to the digital input signal to adjust the phase thereof, and to perform the Hilbert transform with respect to the digital output signal to adjust the phase thereof. The direct conversion unit 11 also multiplies the digital oscillating signal having the adjusted phase by the digital input signal having the adjusted phase to generate a first multiplication result, and multiplies the digital oscillating signal having the adjusted phase by the digital output signal having the adjusted phase to generate a second multiplication result. In response to the first multiplication result and the second multiplication result, the direct conversion unit 11 may obtain the ratio between the amplitude of the analog input signal and the amplitude of the analog output signal, as will be described later. In response to the first multiplication result and the second multiplication result, further, the direct conversion unit 11 may obtain the difference between the phase of the analog input signal and the phase of the analog output signal, as will be described later.

Figure 3:
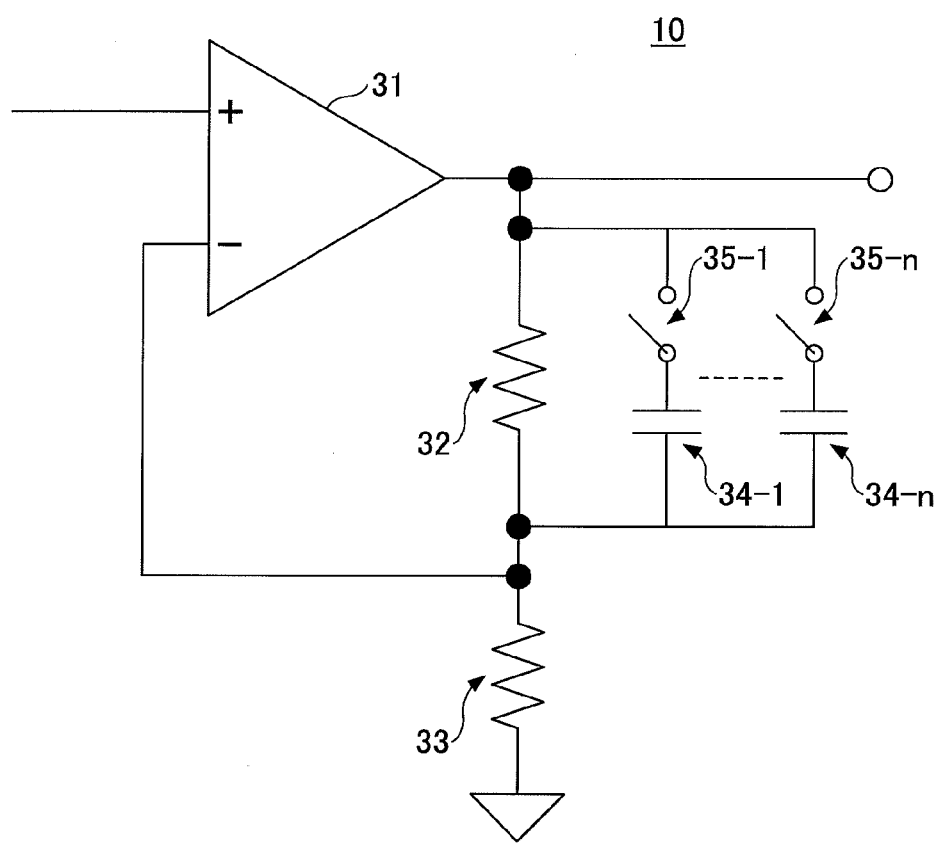
FIG. 3 is a drawing illustrating an example of the detailed configuration of the circuit.

FIG. 3 is a drawing illustrating an example of the detailed configuration of the circuit 10. The circuit 10 illustrated in FIG. 3 includes an amplifier 31, resistive elements 32 and 33, n (n: integer larger than one) capacitive elements 34-1 through 34-n, and n switch circuits 35-1 through 35-n. The amplifier 31 corresponds to the amplifier 21 and the subtraction circuit 23 illustrated in FIG. 2. The resistive elements 32 and 33, the capacitive elements 34-1 through 34-n, and the switch circuits 35-1 through 35-n correspond to the feedback circuit 22 illustrated in FIG. 2.

The configuration illustrated in FIG. 3 allows the capacitance value of the feedback circuit portion to be variably settable. Specifically, a desired number of switch circuits among the switch circuits 35-1 through 35-n may be selectively set in a conductive state, and the remaining switch circuits are set in a nonconductive state, thereby setting a desired value to the capacitance value coupled in parallel to the resistive element 32. In the configuration illustrated in FIG. 3, at least one of the resistive elements 32 and 33 may be a variable resistive element.

At least one of the capacitance value and the resistance value of the circuit illustrated in FIG. 3 may be adjusted based on the loop-gain characteristics obtained by the direct conversion unit 11 illustrated in FIG. 1. More specifically, the gain margin and phase margin of the loop gain may be obtained in accordance with the amplitude ratio (i.e., voltage ratio) and phase difference between the analog input signal and the analog output signal obtained by the direct conversion unit 11. At least one of the capacitance value and the resistance value of the circuit illustrated in FIG. 3 is then adjusted to set the characteristics of the feedback circuit portion such as to ensure a sufficient gain margin and a sufficient phase margin.

Figure 4:
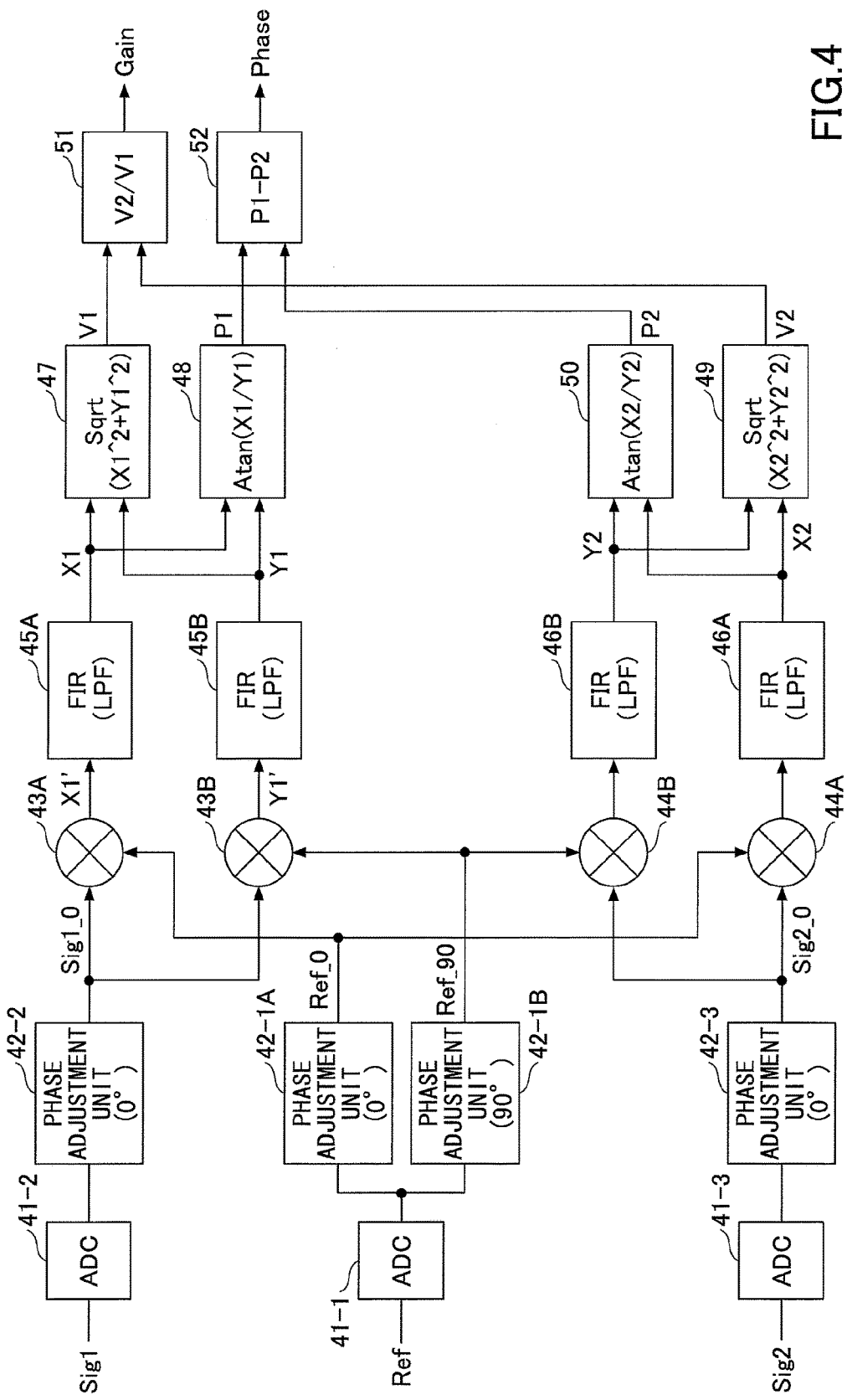
FIG. 4 is a drawing illustrating an example of the configuration of an electronic circuit serving as a direct conversion unit.

FIG. 4 is a drawing illustrating an example of the configuration of an electronic circuit serving as the direct conversion unit 11. The electronic circuit illustrated in FIG. 4 includes AD converters (ADC) 41-1 through 41-3, phase adjustors 42-1A, 42-1B, 42-2 and 42-3, mixer circuits 43A and 43B, and mixer circuits 44A and 44B. The circuit illustrated in FIG. 4 further includes FIR (finite impulse response) filters 45A and 45B, FIR filters 46A and 46B, an amplitude calculating circuit 47, a phase calculating circuit 48, an amplitude calculating circuit 49, a phase calculating circuit 50, an amplitude-ratio calculating circuit 51, and a phase-difference calculating circuit 52.

The AD converters 41-1, 41-2, and 41-3 performs AD conversion with respect to an analog oscillating signal Ref, an analog input signal Sig1, and an analog output signal Sig2, respectively, to produce a digital oscillating signal, a digital input signal, and a digital output signal, respectively. The analog oscillating signal Ref is the oscillating signal of the oscillating circuit 13 illustrated in FIG. 1. The analog input signal Sig1 is the input signal applied to the input terminal PIN2 of the circuit 10. The analog output signal Sig2 is the output signal produced at the output terminal POUT of the circuit 10.

In the case of the direct conversion used in high-frequency wireless communication (e.g., in the range of a few hundred MHz to a few GHz or more), no AD converter is available that can perform high-precision AD conversion with respect to high-speed signals, so that down-conversion is first performed in the analog domain before AD conversion is performed. In contrast, the configuration illustrated in FIG. 1 that measures the gain characteristics of the circuit may be used for the purpose of performing measurements in the frequency range of 0 Hz to approximately 10 MHz. Because of this, AD conversion can be performed at the first stage, and, then, the remaining processing is properly performed in the digital signal domain. This configuration avoids the problem that an AFE, a mixer circuit, and a low-pass filter circuit implemented by use of analog circuits have characteristics likely to vary in response to temperature change and due to deterioration with time. Further, the use of phase adjustors utilizing the Hilbert transform allows a 90-degree phase displacement to be created accurately with respect to various frequencies, unlike in the case of analog processing. Moreover, the use of the Hilbert transform enables the efficient removal of DC offsets at the same time as the phase adjustment.

The phase adjustors 42-1A, 42-1B, 42-2 and 42-3 are circuits which have the same configuration, and utilize the Hilbert transform to perform both phase adjustment and DC offset removal with respect to input digital signals. Specifically, the phase adjustor 42-1A imposes a constant delay and performs the Hilbert transform to impose a 0-degree phase delay and to remove a DC offset with respect to the digital oscillating signal generated by the AD converter 41-1. The phase adjustor 42-1B imposes a constant delay and performs the Hilbert transform to impose a 90-degree phase delay and to remove a DC offset with respect to the digital oscillating signal generated by the AD converter 41-1. The phase adjustor 42-2 imposes a constant delay and performs the Hilbert transform to impose a 0-degree phase delay and to remove a DC offset with respect to the digital input signal generated by the AD converter 41-2. The phase adjustor 42-3 imposes a constant delay and performs the Hilbert transform to impose a 0-degree phase delay and to remove a DC offset with respect to the digital output signal generated by the AD converter 41-3. The constant delays imposed by the phase adjustors are of the same length because all the phase adjustors have the same configuration. Accordingly, no phase difference occurs between the signals due to this constant delay. In the following, this constant delay will be disregarded.

The digital oscillating signal Ref may be expressed as follows.

$$Ref = A0 + A1\cos(\omega t)$$

The phase adjustor 42-1A imposes a 0-degree phase delay and removes a DC offset with respect to the signal Ref to generate a signal Ref_0 that is expressed as follows.

$$Ref\_0 = A1\cos(\omega t)$$

The phase adjustor 42-1B imposes a 90-degree phase delay and removes a DC offset with respect to the signal Ref to generate a signal Ref_90 that is expressed as follows.

$$Ref\_90 = A1\sin(\omega t)$$

Similarly, the digital input signal Sig1 may be expressed as follows.

$$Sig1 = B0 + B1\cos(\omega t + \theta 1)$$

The phase adjustor 42-2 imposes a 0-degree phase delay and removes a DC offset with respect to the signal Sig1 to generate a signal Sig1_0 that is expressed as follows.

$$Sig1\_0 = B1\cos(\omega t + \theta 1)$$

Similarly, the digital input signal Sig2 may be expressed as follows.

$$Sig2 = C0 + C1\cos(\omega t + \theta 2)$$

The phase adjustor 42-3 imposes a 0-degree phase delay and removes a DC offset with respect to the signal Sig2 to generate a signal Sig2_0 that is expressed as follows.

$$Sig2\_0 = C1\cos(\omega t + \theta 2)$$

The mixer circuits 43A and 43B multiplies the output of the phase adjustor 42-2 by the outputs of the phase adjustors 42-1A and 42-1B, respectively. Specifically, the mixer circuit 43A multiplies the signal Ref_0 by the signal Sig1_0, and the mixer circuit 43B multiplies the signal Ref_90 by the signal Sig1_0. Similarly, the mixer circuits 44A and 44B multiplies the output of the phase adjustor 42-3 by the outputs of the phase adjustors 42-1A and 42-1B, respectively. Specifically, the mixer circuit 44A multiplies the signal Ref_0 by the signal Sig2_0, and the mixer circuit 44B multiplies the signal Ref_90 by the signal Sig2_0.

An output X1' of the mixer circuit 43A is expressed as follows.

$$X1' = Ref\_0 \cdot Sig1\_0$$
$$= A1\cos(\omega t) \cdot B1\cos(\omega t + \theta 1)$$
$$= -(1/2) \cdot A1 \cdot B1 \cdot (\cos(2\omega t + \theta 1) + \cos(\theta 1))$$

An output Y1' of the mixer circuit 43B is expressed as follows.

$$Y1' = Ref\_90 \cdot Sig1\_0$$
$$= A1\sin(\omega t) \cdot B1\cos(\omega t + \theta 1)$$
$$= (1/2) \cdot A1 \cdot B1 \cdot (\sin(2\omega t + \theta 1) - \sin(\theta 1))$$

The outputs of the mixer circuits 44A and 44B are the same as the outputs of the mixer circuits 43A and 43B, except that Sig1_0 is replaced with Sig2_0 in the above-noted formulas.

The FIR filters 45A and 45B perform low-pass filtering with respect to the output signals of the mixer circuits 43A and 43B, respectively, to remove or suppress the high-frequency components in these signals. The FIR filters 46A and 46B perform low-pass filtering with respect to the output signals of the mixer circuits 44A and 44B, respectively, to remove or suppress the high-frequency components in these signals. The FIR filters 45A and 45B and the FIR filters 46A and 46B may have frequency characteristics such that the attenuation ratio is 1/100 to 1/1000 at a frequency of $2\omega$.

Specifically, a signal X1 obtained by performing low-pass filtering with respect to the output signal X1' of the mixer circuit 43A is expressed as follows.

$$X1 = (1/2) \cdot A1 \cdot B1 \cdot \cos(\theta 1)$$

Further, a signal Y1 obtained by performing low-pass filtering with respect to the output signal Y1' of the mixer circuit 43B is expressed as follows.

$$Y1 = -(1/2) \cdot A1 \cdot B1 \cdot \sin(\theta 1)$$

Signals X2 and Y2 obtained by performing low-pass filtering with respect to the outputs of the mixer circuits 44A and 44B are the same as the signals noted above, except that B1 and $\theta 1$ are replaced with C1 and $\theta 2$, respectively, in the above noted formulas. Namely, these signals are expressed as follows.

$$X2=(1/2)\cdot A1\cdot C1\cdot \cos(\theta 2)$$

$$Y2=-(1/2)\cdot A1\cdot C1\cdot \sin(\theta 2)$$

The amplitude calculating circuit 47 obtains, from the signals obtained through low-pass filtering by the FIR filters 45A and 45B, a value V1 responsive to the amplitude of the analog input signal previously described. The phase calculating circuit 48 obtains, from the signals obtained through low-pass filtering by the FIR filters 45A and 45B, a value P1 responsive to the phase of the analog input signal previously described. The amplitude calculating circuit 49 obtains, from the signals obtained through low-pass filtering by the FIR filters 46A and 46B, a value V2 responsive to the amplitude of the analog output signal previously described. The phase calculating circuit 50 obtains, from the signals obtained through low-pass filtering by the FIR filters 46A and 46B, a value P2 responsive to the phase of the analog output signal previously described.

Specifically, V1, P1, V2, and P2 are obtained as follows.

$$V1=(X1^2+Y1^2)^{1/2}=(1/2)\cdot A1\cdot B1$$

$$P1=\tan^{-1}(Y1/X1)=\tan^{-1}(\sin(\theta 1)/\cos(\theta 1))=\theta 1$$

$$V2=(X2^2+Y_22)^{1/2}=(1/2)\cdot A1\cdot C1$$

$$P2=\tan^{-1}(-Y2/X2)=\tan^{-1}(\sin(\theta 2)/\cos(\theta 2))=\theta 2$$

The amplitude-ratio calculating circuit 51 obtains the ratio between the amplitude of the analog input signal and the amplitude of the analog output signal from the value V1 and the value V2. A ratio Gain is expressed as follows.

$$\text{Gain}=V2/V1=C1/B1$$

The phase-difference calculating circuit 52 obtains a difference between the phase of the analog input signal and the phase of the analog output signal from the value P1 and the value P2. A phase difference Phase is expressed as follows.

$$\text{Phase}=P1-P2=\theta 1-\theta 2$$

In the manner as described above, the electronic circuit illustrated in FIG. 4 performs direct conversion to obtain the ratio between the amplitude of the analog input signal and the amplitude of the analog output signal as well as the difference between the phase of the analog input signal and the phase of the analog output signal. In so doing, the phase adjustors having the same configuration are used in the respective signal paths, thereby avoiding the generation of differences in characteristics and timing between the signal paths and enabling the reliable removal of DC offsets and an accurate phase adjustment with respect to various frequencies.

Figure 5:
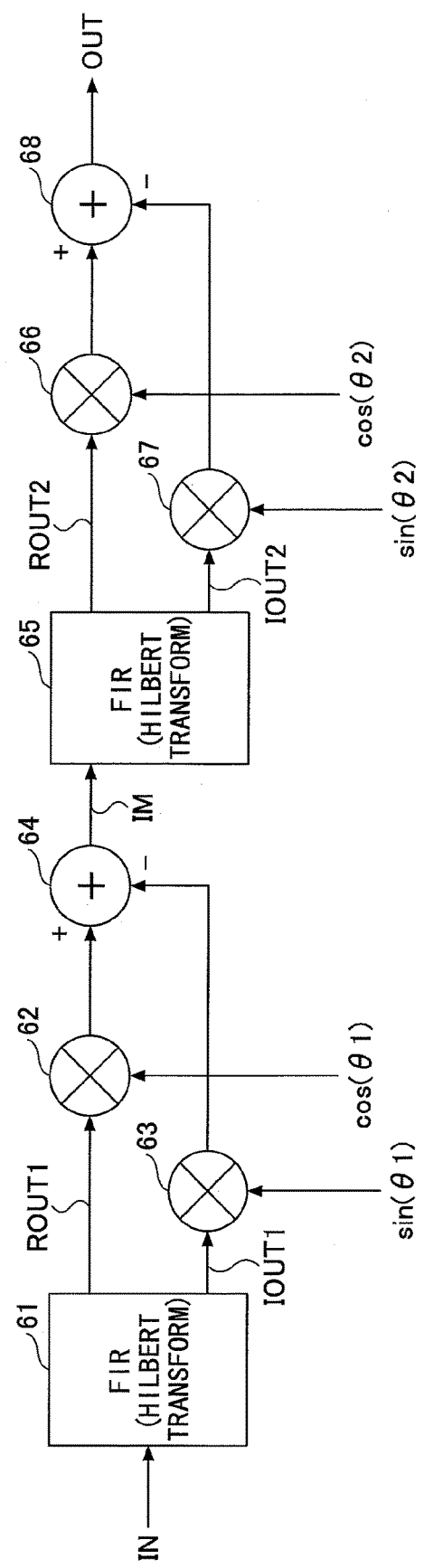
FIG. 5 is a drawing illustrating an example of the configuration of a phase adjustor.

FIG. 5 is a drawing illustrating an example of the configuration of a phase adjustor. The phase adjustor illustrated in FIG. 5 may be used as the phase adjustors 42-1A, 42-1B, 42-2 and 42-3 illustrated in FIG. 4. The phase adjustor illustrated in FIG. 5 includes an FIR filter 61, a multiplication circuit 62, a subtraction circuit 64, an FIR filter 65, a multiplication circuit 66, a multiplication circuit 67, and a subtraction circuit 68.

The FIR filters 61 and 65 may all have the same configuration. The FIR filter 61 serves to calculate the Hilbert transform with respect to an input signal IN. The Hilbert transform has frequency characteristics as follows.

$$D(e^{j\omega T}) = \begin{cases} -j(0 < \omega T < \pi) \\ 0(\omega T = 0) \\ j(-\pi < \omega T < 0) \end{cases}$$

The Hilbert transform produces a signal orthogonal to an input signal. In the case of the input signal being regarded as an in-phase component (i.e., real part) of an analytic signal, the Hilbert transform produces a signal equal to the orthogonal component (i.e., imaginary part) of such an analytic signal. The FIR filter 61 illustrated in FIG. 5 outputs a signal ROUT1 that is obtained by imposing a delay D of the FIR filter with respect to the input signal IN, and also outputs a signal IOUT1 that is obtained by imposing the delay D and also imposing a 90-degree phase delay through the Hilbert transform with respect to the input signal IN. The multiplication circuit 62 multiplies the signal ROUT1 by $\cos(\theta 1)$, and the multiplication circuit 63 multiplies the signal IOUT1 by $\sin(\theta 1)$. Here, $\theta 1$ is a phase that can be set as desired. The subtraction circuit 64 subtracts the multiplication result of the multiplication circuit 63 from the multiplication result of the multiplication circuit 62. The result of subtraction obtained by the subtraction circuit 64 is applied as a signal IM to the FIR filter 65. The FIR filter 65 outputs a signal ROUT2 that is obtained by imposing a delay D of the FIR filter with respect to the signal IM, and also outputs a signal IOUT2 that is obtained by imposing the delay D and also imposing a 90-degree phase delay through the Hilbert transform with respect to the input signal IM. The multiplication circuit 66 multiplies the signal ROUT2 by $\cos(\theta 2)$, and the multiplication circuit 67 multiplies the signal IOUT2 by $\sin(\theta 2)$. Here, $\theta 2$ is a phase that can be set as desired. The subtraction circuit 68 subtracts the multiplication result of the multiplication circuit 67 from the multiplication result of the multiplication circuit 66. The result of subtraction obtained by the subtraction circuit 68 is output as an output signal OUT of the phase adjustor.

In the case of the input signal IN being $\cos(\omega t)$, for example, the signal ROUT1, the signal IOUT1, and the signal IM are expressed as follows.

$$ROUT1 = \cos(\omega t + D)$$

$$IOUT1 = \sin(\omega t + D)$$

$$IM = \cos(\omega t + D)\cdot\cos(\theta 1) - \sin(\omega t + D\cdot\sin(\theta 1)$$
$$= (1/2)\ [\cos(\omega t + D + \theta 1) + \cos(\omega t + D - \theta 1)] +$$
$$(1/2)\ [\cos(\omega t + D + \theta 1) - \cos(\omega t + D - \theta 1)]$$
$$= \cos(\omega t + D + \theta 1)$$

With similar calculation, the output signal OUT is expressed as follows.

$$\text{OUT}=\cos(\omega t+2D+\theta 1+\theta 2)$$

Setting either one of $\theta 1$ and $\theta 2$ to 90 degrees causes the output signal OUT to have a direct-current component that is zero regardless of whether the input signal IN includes a DC offset. This is due to the characteristics of the Hilbert transform whose direct-current component is zero.

In FIG. 4, one or more of the phase adjustors 42-1A, 42-1B, 42-2 and 42-3 of which the phase delay is 0 degree are implemented by setting either one (e.g., $\theta 1$) of $\theta 1$ and $\theta 2$ to 90 degrees in FIG. 5 and setting the other (e.g., $\theta 2$) to 0 degree. Further, one or more of the phase adjustors 42-1A, 42-1B, 42-2 and 42-3 of which the phase delay is 90 degrees are implemented by setting either one (e.g., θ1) of θ1 and θ2 to 90 degrees in FIG. 5 and setting the other (e.g., θ2) also to 90 degrees. The phase delays required of the respective phase adjustors in the direct conversion unit 11 of FIG. 4 are relative phase delays between the phase adjustors. Accordingly, the arrangement in which the first phase adjustor has a phase delay of 90 degrees and the second phase adjustor has a phase delay of 180 degrees (=90 degrees+90 degrees) produces the same results as the arrangement in which the first phase adjustor has a phase delay of 0 degree and the second phase adjustor has a phase delay of 90 degrees. Such a phase delay arrangement also serves to perform the Hilbert transform in both the first phase adjustor and the second phase adjustor, thereby enabling the removal of DC offsets.

Figure 6:
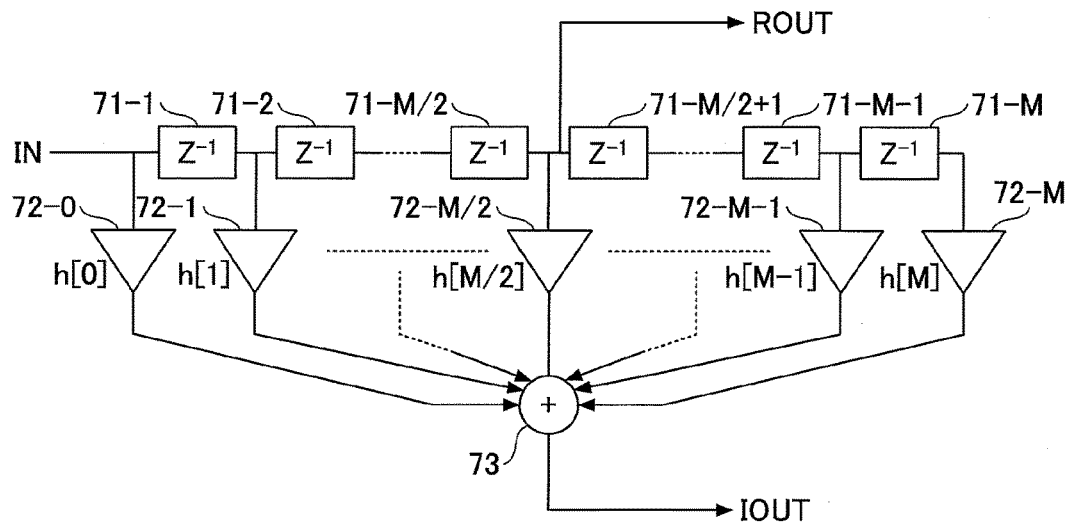
FIG. 6 is a drawing illustrating an example of the configuration of an FIR filter for calculating the Hilbert transform.

FIG. 6 is a drawing illustrating an example of the configuration of an FIR filter for calculating the Hilbert transform. The FIR filter illustrated in FIG. 6 may be used as the FIR filters 61 and 65 illustrated in FIG. 5.

The FIR filter illustrated in FIG. 6 is an FIR filter of odd length that includes M (M: even number larger than one) delay elements 71-1 through 71-M, M+1 multipliers 72-0 through 72-M, and an adder 73. The delay elements 71-1 through 71-M are series-connected in one line. The input signal IN input into the first delay element experiences successive delays, each of which is imposed by a corresponding one of the delay elements and equal to one unit time (e.g., one clock cycle). The multipliers 72-0 through 72-M receive inputs that are obtained by imposing delay lengths of 0 to M, respectively, with respect to the input signal IN, and multiply the received inputs by respective multiplication factors equal to the respective filter coefficients. The adder 73 calculates the sum of the outputs of the multipliers 72-0 through 72-M to outputs the obtained sum as the output signal IOUT. The output signal IOUT corresponds to IOUT1 and IOUT2 illustrated in FIG. 5.

The signal having passed through the first M/2 delay elements 71-1 through 71-M/2 among the delay elements 71-1 through 71-M is output as the output signal ROUT. The output signal ROUT corresponds to ROUT1 and ROUT2 illustrated in FIG. 5.

The coefficients of the multipliers 72-0 through 72-M are $h[0]$ through $h[M]$, respectively. The coefficients $h[0]$ through $h[M]$ are defined as follows.

$$h[m + M/2] = \begin{cases} \dfrac{2\sin^2(m\pi/2)}{m\pi} & m:\text{odd number} \\ 0 & m:\text{even number} \end{cases}$$

Here, m is an integer in the range of $-M/2$ to $M/2$. The transfer function of the FIR filter illustrated in FIG. 6 with respect to the output ROUT is expressed as follows.

$$H(z) = \sum_{m=0}^{M} h[m]z^{-m}$$

$$= \sum_{m=0}^{M/2-1} h[m]z^{-m} + \sum_{m=M/2+1}^{M} h[m]z^{-m} + h[M/2]z^{-M/2}$$

$$= \sum_{m=0}^{M/2-1} h[m]z^{-m} - \sum_{m=0}^{M/2-1} h[M-m]z^{-(M-m)}$$

$$= z^{-M/2}\left[\sum_{m=0}^{M/2-1} h[m]\left(z^{(M/2-m)} + z^{-(M/2-m)}\right)\right]$$

The derivation of the above-noted formula utilizes the fact that $h[m+M/2]$ is an odd function having the center at the point of $m=0$. Substituting $e^{j\omega t}$ for z in order to obtain the frequency characteristics of the filter results in the following.

$$H(e^{j\omega T}) = e^{-jM\omega T/2}\left[\sum_{m=0}^{M/2-1} h[m]\left(e^{j(M/2-m)\omega T} + e^{-j(M/2-m)\omega T}\right)\right]$$

$$= e^{-jM\omega T/2}\left[j2\sum_{m=0}^{M/2-1} h[m]\sin((M/2-m)\omega T)\right]$$

$$= e^{-j\frac{M\omega T-\pi}{2}}\left[2\sum_{m=0}^{M/2-1} h[m]\sin((M/2-m)\omega T)\right]$$

Figure 7:
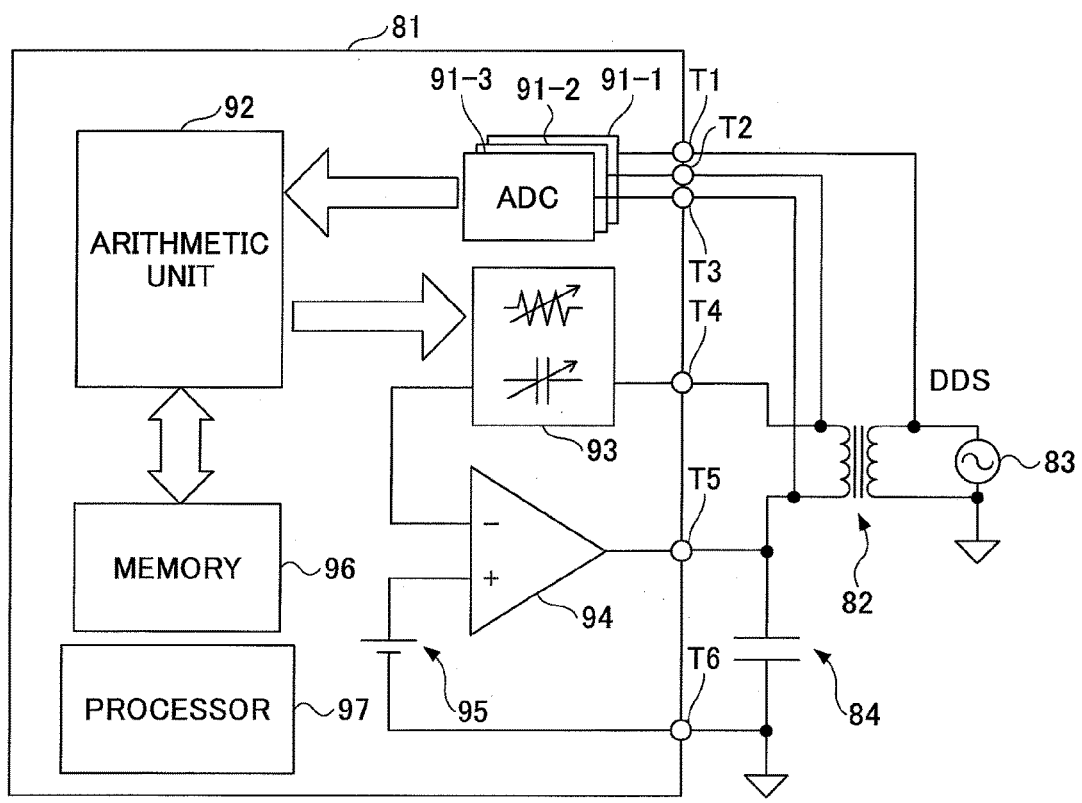
FIG. 7 is a drawing illustrating an example of the configuration of a system inclusive of a power supply circuit.

FIG. 7 is a drawing illustrating an example of the configuration of a system inclusive of a power supply circuit. The system illustrated in FIG. 7 includes a SoC (i.e., system on chip) 81, a transducer 82, an oscillating circuit 83 and a capacitor 84. The SoC 81 may be an integrated circuit, and includes AD converters 91-1 through 91-3, an arithmetic unit 92, a feedback circuit 93, an amplifier 94, a constant voltage source 95, a memory 96, and a processor 97.

The oscillating circuit 83 may be a direct digital synthesizer (DDS) or the like that produces an oscillating waveform having a frequency responsive to input digital data. The oscillating signal produced by the oscillating circuit 83 is applied to the primary side of the transducer 82. The output terminal of the oscillating circuit 83 opposite to the ground-side output terminal thereof produces a voltage signal (i.e., first analog signal) applied to the AD converter 91-1 through a terminal T1 of the SoC 81. A first terminal of the secondary winding of the transducer 82 produces a voltage signal (i.e., second analog signal) applied to the AD converter 91-2 through a terminal T2 of the SoC 81. A second terminal of the secondary winding of the transducer 82 produces a voltage signal (i.e., third analog signal) applied to the AD converter 91-3 through a terminal T3 of the SoC 81. The second terminal of the secondary winding of the transducer 82 is coupled to one end of the capacitor 84, and the other end of the capacitor 84 is coupled to the ground.

The first terminal of the secondary winding of the transducer 82 is coupled to one end of the feedback circuit 93 through a terminal T4 of the SoC 81. The second terminal of the secondary winding of the transducer 82 is coupled to the output terminal of the amplifier 94 through a terminal T5 of the SoC 81. The other end of the feedback circuit 93 is coupled to the inverted input terminal of the amplifier 94. The constant voltage source 95 is situated between the non-inverted input terminal of the amplifier 94 and a terminal T6 of the SoC 81 that is coupled to the ground.

The constant voltage source 95 is reference voltage generating circuit that outputs a constant voltage, and may be a BGR (band gap reference) circuit. The amplifier 94 generates a power supply voltage in response to the constant voltage generated by the constant voltage source 95. The feedback circuit 93 supplies a negative feedback signal to the input of the amplifier 94.

The AD converters 91-1 through 91-3 perform AD conversion with respect to the first analog signal, the second analog signal, and the third analog signal to generate the first digital signal, the second digital signal, and the third digital signal, respectively. The arithmetic unit 92 adjusts the characteristics of the feedback circuit 93 in response to the outputs of the AD converters 91-1 through 91-3.

The arithmetic unit 92 may include the electronic circuit illustrated in FIG. 4, except for the AD converters 41-1 through 41-3. Specifically, the arithmetic unit 92 includes a first phase adjustor configured to perform the Hilbert transform to adjust the phase of the first digital signal to produce a phase-adjusted signal, and also includes a second phase adjustor configured to perform the Hilbert transform to adjust the phase of the second digital signal to produce a phase-adjusted signal. The arithmetic unit 92 further includes a third phase adjustor configured to perform the Hilbert transform to adjust the phase of the third digital signal to produce a phase-adjusted signal. The arithmetic unit 92 further includes a first mixer circuit configured to multiply the output of the first phase adjustor and the output of the second phase adjustor, and includes a second mixer circuit configured to multiply the output of the first phase adjustor and the output of the third phase adjustor. The arithmetic unit 92 may adjust the characteristics of the feedback circuit 93 in response to the output of the first mixer circuit and the output of the second mixer circuit.

The operation of the arithmetic unit 92 to measure the loop-gain characteristics is the same as or similar to the operation described in connection with the electronic circuit illustrated in FIG. 4. The arithmetic unit 92 may adjust at least one of the capacitance values and the resistance values of the feedback circuit 93 based on the measured loop-gain characteristics. More specifically, the gain margin and phase margin of the loop gain may be obtained based on the amplitude ratio (i.e., voltage ratio) and phase difference between the analog input signal (i.e., second analog signal) and the analog output signal (i.e., third analog signal). At least one of the capacitance values and the resistance values of the feedback circuit 93 is then adjusted to set the characteristics of the feedback circuit 93 such as to ensure a sufficient gain margin and a sufficient phase margin.

The arithmetic unit 92 may be an arithmetic apparatus such as a CPU (central processing unit) that operates based on software, rather than an electronic circuit as illustrated in FIG. 4. Even in this case, the processes performed by the arithmetic unit 92 are the same as or similar to the processes described above. A program for calculating the amplitude and phase characteristics that is executed by the arithmetic unit 92 may be stored in the memory 96.

The transducer 82 and the oscillating circuit 83 are circuit components external to and attached to the SoC 81 for the purpose of measuring the characteristics of the feedback loop constituted by the feedback circuit 93 and the amplifier 94. During a routine operation of the SoC 81, the transducer 82 and the oscillating circuit 83 are detached from the SoC 81, and the terminal T5 is directly connected to the terminal T4 to use the feedback circuit 93, the amplifier 94, and the constant voltage source 95 as a power supply circuit. Circuit modules of the SoC 81 such as the memory 96 and the processor 97 may operate with a drive voltage that is the power supply voltage produced by the amplifier 94. The output of the amplifier 94 may directly be connected to the memory 96 and the processor 97 inside the SoC 81 to supply a drive voltage. Alternatively, the terminal T5 may be connected to a power-supply-input terminal (not shown) to supply the drive voltage to the memory 96 and the processor 97. The power supply voltage appearing at the terminal T5 may be supplied as a drive voltage to another chip separate from the SoC 81.

Figure 8:
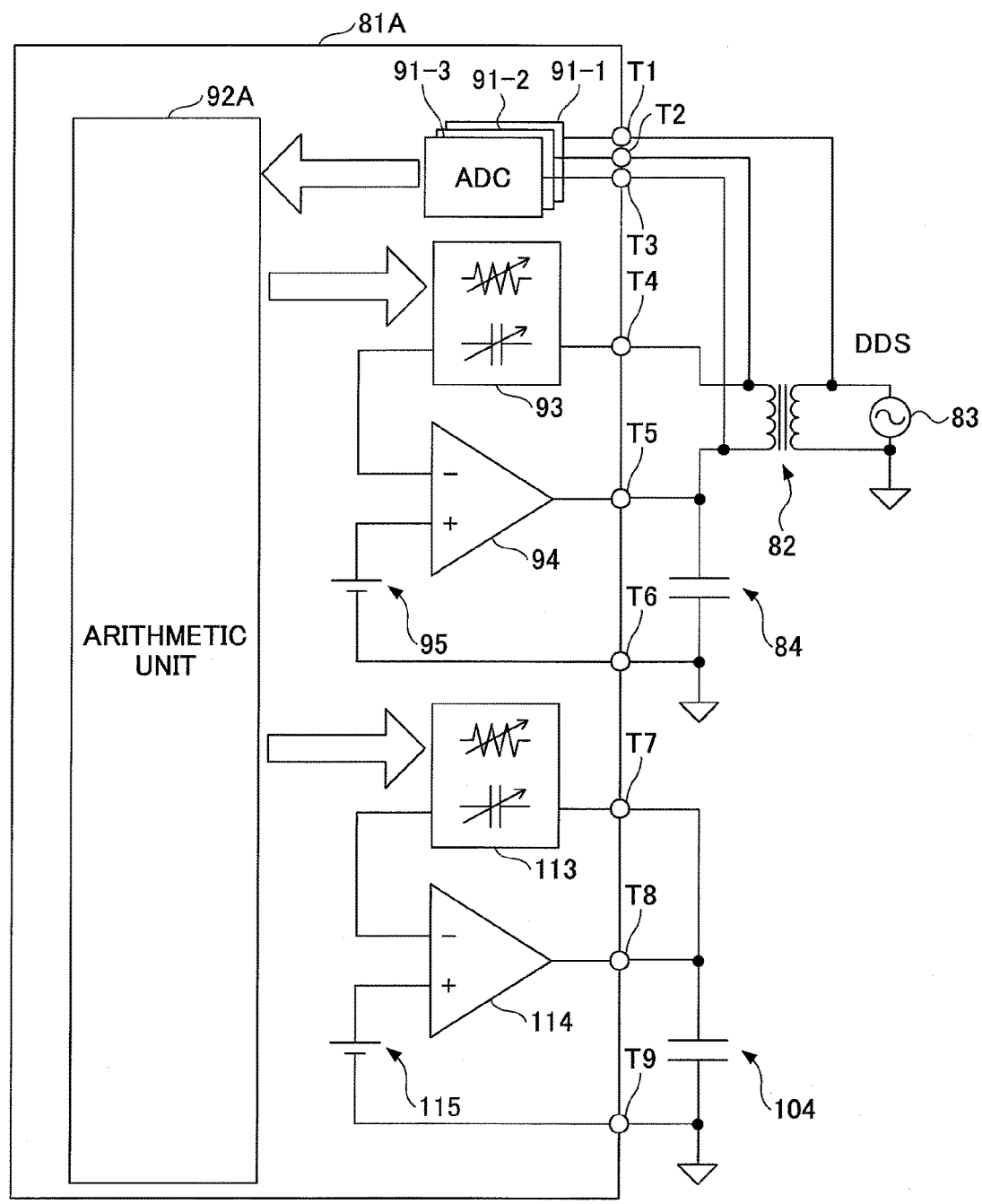
FIG. 8 is a drawing illustrating another example of the configuration of a system inclusive of a power supply circuit.

FIG. 8 is a drawing illustrating another example of the configuration of a system inclusive of a power supply circuit. The system illustrated in FIG. 8 includes a SoC (i.e., system on chip) 81A, a transducer 82, an oscillating circuit 83, a capacitor 84, and a capacitor 104. The SoC 81A includes the AD converters 91-1 through 91-3, an arithmetic unit 92A, the feedback circuit 93, the amplifier 94, the constant voltage source 95, a feedback circuit 113, an amplifier 114, and a constant voltage source 115. The SoC 81A may include additional circuit modules such as the memory 96 and the processor 97 as in the case of the SoC 81. The feedback circuit 93, the amplifier 94, and the constant voltage source 95 have the same circuit configuration and the same design characteristics as the feedback circuit 113, the amplifier 114, and the constant voltage source 115, respectively.

A connection by which terminals T7 and T8 of the SoC 81A are coupled to each other causes the output of the amplifier 114 to be coupled to one end of the feedback circuit 113. The other end of the feedback circuit 113 is coupled to the inverted input terminal of the amplifier 114. This arrangement serves to form a feedback loop including the feedback circuit 113 and the amplifier 114. The constant voltage source 115 is situated between the non-inverted input terminal of the amplifier 114 and a terminal T9 of the SoC 81A that is coupled to the ground. The capacitor 104 is connected between the terminal T9 and the terminal T8. With the above-noted connections, the feedback circuit 113, the amplifier 114, the constant voltage source 115, and the capacitor 84 serve as a power supply circuit to supply a power supply voltage. Namely, the power-supply voltage output by the amplifier 114 may be supplied as a drive voltage to the internal circuit modules of the SoC 81A, or may be supplied as a drive voltage to a circuit module external to the SoC 81A.

In the system illustrated in FIG. 8, the transducer 82, the oscillating circuit 83, the capacitor 84, the AD converters 91-1 through 91-3, the arithmetic unit 92A, the feedback circuit 93, the amplifier 94, and the constant voltage source 95 together serve as a monitor circuit for measuring the characteristics of a feedback loop. The arithmetic unit 92A measures the characteristics of the feedback loop including the feedback circuit 93 and the amplifier 94 as in the same or similar manner as the arithmetic unit 92 illustrated in FIG. 7 based on the digital signals from the AD converters 91-1 through 91-3, thereby adjusting the characteristics of the feedback circuit 93 in response to the results of the measurements. Namely, the arithmetic unit 92A adjusts at least one of the capacitance values and resistance values of the feedback circuit 93 based on the gain margin and phase margin of the measured loop gain, thereby setting the characteristics of the feedback circuit 93 such as to ensure a sufficient gain margin and a sufficient phase margin.

The arithmetic unit 92A further adjusts the characteristics of the feedback circuit 113 based on the measured characteristics of the feedback loop including the feedback circuit 93 and the amplifier 94. Namely, the arithmetic unit 92A adjusts at least one of the capacitance values and resistance values of the feedback circuit 113 based on the gain margin and phase margin of the measured loop gain, thereby setting the characteristics of the feedback circuit 113 such as to ensure a sufficient gain margin and a sufficient phase margin.

With the configuration and operations described above, the system illustrated in FIG. 8 adjusts both the characteristics of the feedback circuit of the monitor circuit and the characteristics of the feedback circuit of the power supply circuit in response to the measured characteristics of the feedback loop of the monitor circuit. With this arrangement, the characteristics of the power supply circuit are dynamically adjusted while supplying a power supply voltage for actual operations to a circuit coupled to the power-supply-voltage output of the power supply circuit.

According to at least one embodiment, the gain characteristics between an input signal and an output signal of an object to be measured are measured with high precision.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electronic circuit, comprising:
   a first circuit configured to receive an analog input signal responsive to an analog oscillating signal having a desired frequency and generate an analog output signal;
   AD converters configured to perform AD conversion with respect to the analog oscillating signal, the analog input signal, and the analog output signal to generate a digital oscillating signal, a digital input signal, and a digital output signal;
   at least one first phase adjustor configured to adjust a phase of the digital oscillating signal through the Hilbert transform to produce an output;
   a second phase adjustor configured to adjust a phase of the digital input signal through the Hilbert transform to produce an output;
   a third phase adjustor configured to adjust a phase of the digital output signal through the Hilbert transform to produce an output;
   a first mixer circuit configured to multiply the output of the first phase adjustor and the output of the second phase adjustor; and
   a second mixer circuit configured to multiply the output of the first phase adjustor and the output of the third phase adjustor.

2. The electronic circuit as claimed in claim 1, wherein each of the first through third phase adjustors includes an FIR filter of an odd length configured to perform the Hilbert transform.

3. The electronic circuit as claimed in claim 1, wherein each of the first through third phase adjustors includes a plurality of FIR filters of an odd length each configured to perform the Hilbert transform, the plurality of FIR filters being configured such that respective, separate phase delays are settable thereto.

4. The electronic circuit as claimed in claim 1, further comprising:
   a first arithmetic circuit configured to obtain, from a signal obtained by performing low-pass filtering with respect to an output of the first mixer circuit, a first value responsive to an amplitude of the analog input signal and a second value responsive to a phase of the analog input signal;
   a second arithmetic circuit configured to obtain, from a signal obtained by performing low-pass filtering with respect to an output of the second mixer circuit, a third value responsive to an amplitude of the analog output signal and a fourth value responsive to a phase of the analog output signal;
   a third arithmetic circuit configured to obtain, from the first value and the third value, a ratio between the amplitude of the analog input signal and the amplitude of the analog output signal; and
   a fourth arithmetic circuit configured to obtain, from the second value and the fourth value, a difference between the phase of the analog input signal and the phase of the analog output signal.

5. The electronic circuit as claimed in claim 1, wherein the first circuit includes:
   an amplifier; and
   a feedback circuit,
   wherein the analog input signal is an input of the feedback circuit, and the analog output signal is an output of the amplifier.

6. The electronic circuit as claimed in claim 5, wherein the feedback circuit has characteristics that are variably adjustable.

7. A power supply circuit, comprising:
   a reference voltage generator circuit configured to output a constant voltage;
   an amplifier configured to generate a power supply voltage in response to the constant voltage;
   a feedback circuit configured to supply a negative feedback signal to an input of the amplifier;
   AD converters configured to perform AD conversion with respect to a first analog signal, a second analog signal, and a third analog signal to output a first digital signal, a second digital signal, and a third digital signal, respectively; and
   an arithmetic unit configured to adjust characteristics of the feedback circuit in response to the outputs of the AD converters,
   wherein the arithmetic unit includes:
   a first phase adjustor configured to adjust a phase of the first digital signal through the Hilbert transform to produce an output;
   a second phase adjustor configured to adjust a phase of the second digital signal through the Hilbert transform to produce an output;
   a third phase adjustor configured to adjust a phase of the third digital signal through the Hilbert transform to produce an output;
   a first mixer circuit configured to multiply the output of the first phase adjustor and the output of the second phase adjustor; and
   a second mixer circuit configured to multiply the output of the first phase adjustor and the output of the third phase adjustor,
   wherein adjustment is variably made to characteristics of the feedback circuit in response to an output of the first mixer circuit and an output of the second mixer circuit.

8. The power supply circuit as claimed in claim 7, wherein each of the first through third phase adjustors includes an FIR filter of an odd length configured to perform the Hilbert transform.

9. The power supply circuit as claimed in claim 7, wherein each of the first through third phase adjustors includes a plurality of FIR filters of an odd length each configured to perform the Hilbert transform, the plurality of FIR filters being configured such that respective, separate phase delays are settable thereto.

10. The power supply circuit as claimed in claim 7, further comprising:
- a first arithmetic circuit configured to obtain, from a signal obtained by performing low-pass filtering with respect to an output of the first mixer circuit, a first value responsive to an amplitude of the second analog signal and a second value responsive to a phase of the second analog signal;
- a second arithmetic circuit configured to obtain, from a signal obtained by performing low-pass filtering with respect to an output of the second mixer circuit, a third value responsive to an amplitude of the third analog signal and a fourth value responsive to a phase of the third analog signal;
- a third arithmetic circuit configured to obtain, from the first value and the third value, a ratio between the amplitude of the second analog signal and the amplitude of the third analog signal; and
- a fourth arithmetic circuit configured to obtain, from the second value and the fourth value, a difference between the phase of the second analog signal and the phase of the third analog signal.

11. An integrated circuit, comprising:
- a reference voltage generator circuit configured to output a constant voltage;
- an amplifier configured to generate a power supply voltage in response to the constant voltage;
- a feedback circuit configured to supply a negative feedback signal to an input of the amplifier;
- AD converters configured to perform AD conversion with respect to a first analog signal, a second analog signal, and a third analog signal to output a first digital signal, a second digital signal, and a third digital signal, respectively; and
- an arithmetic unit configured to adjust characteristics of the feedback circuit in response to the outputs of the AD converters,
wherein the arithmetic unit includes:
- a first phase adjustor configured to adjust a phase of the first digital signal through the Hilbert transform to produce an output;
- a second phase adjustor configured to adjust a phase of the second digital signal through the Hilbert transform to produce an output;
- a third phase adjustor configured to adjust a phase of the third digital signal through the Hilbert transform to produce an output;
- a first mixer circuit configured to multiply the output of the first phase adjustor and the output of the second phase adjustor;
- a second mixer circuit configured to multiply the output of the first phase adjustor and the output of the third phase adjustor; and
- a core circuit configured to operate with a drive voltage that is the power supply voltage,
wherein adjustment is variably made to characteristics of the feedback circuit in response to an output of the first mixer circuit and an output of the second mixer circuit.

12. The integrated circuit as claimed in claim 11, wherein each of the first through third phase adjustors includes an FIR filter of an odd length configured to perform the Hilbert transform.

13. The integrated circuit as claimed in claim 11, wherein each of the first through third phase adjustors includes a plurality of FIR filters of an odd length each configured to perform the Hilbert transform, the plurality of FIR filters being configured such that respective, separate phase delays are settable thereto.

14. The integrated circuit as claimed in claim 11, further comprising:
- a first arithmetic circuit configured to obtain, from a signal obtained by performing low-pass filtering with respect to an output of the first mixer circuit, a first value responsive to an amplitude of the second analog signal and a second value responsive to a phase of the second analog signal;
- a second arithmetic circuit configured to obtain, from a signal obtained by performing low-pass filtering with respect to an output of the second mixer circuit, a third value responsive to an amplitude of the third analog signal and a fourth value responsive to a phase of the third analog signal;
- a third arithmetic circuit configured to obtain, from the first value and the third value, a ratio between the amplitude of the second analog signal and the amplitude of the third analog signal; and
- a fourth arithmetic circuit configured to obtain, from the second value and the fourth value, a difference between the phase of the second analog signal and the phase of the third analog signal.

15. A method of measuring characteristics of a circuit, comprising:
- applying an analog input signal responsive to an analog oscillating signal having a desired frequency to a circuit to cause the circuit to output an analog output signal;
- performing AD conversion with respect to the analog oscillating signal, the analog input signal, and the analog output signal to generate a digital oscillating signal, a digital input signal, and a digital output signal;
- adjusting a phase of the digital oscillating signal through the Hilbert transform;
- adjusting a phase of the digital input signal through the Hilbert transform;
- adjusting a phase of the digital output signal through the Hilbert transform;
- multiplying the phase-adjusted digital oscillating signal and the phase-adjusted digital input signal to generate a first multiplication result;
- multiplying the phase-adjusted digital oscillating signal and the phase-adjusted digital output signal to generate a second multiplication result;
- obtaining a ratio between an amplitude of the analog input signal and an amplitude of the analog output signal in response to the first multiplication result and the second multiplication result; and
- obtaining a difference between a phase of the analog input signal and a phase of the analog output signal in response to the first multiplication result and the second multiplication result.

16. A non-transitory recording medium having a program stored therein for calculating amplitude and phase characteristics, the program causing an arithmetic apparatus to perform:
- adjusting a phase of a first digital signal through the Hilbert transform;
- adjusting a phase of a second digital signal through the Hilbert transform;
- adjusting a phase of a third digital signal through the Hilbert transform;

multiplying the phase-adjusted first digital signal and the phase-adjusted second digital signal to generate a first multiplication result;

multiplying the phase-adjusted first digital signal and the phase-adjusted third digital signal to generate a second multiplication result;

obtaining a ratio between an amplitude of the second digital signal and an amplitude of the third digital signal in response to the first multiplication result and the second multiplication result; and obtaining a difference between a phase of the second digital signal and a phase of the third digital signal in response to the first multiplication result and the second multiplication result, wherein the first digital signal is a digital oscillating signal obtained by AD-converting an analog oscillating signal having a desired frequency, and the second digital signal is a digital input signal obtained by AD-converting an analog input signal responsive to the analog oscillating signal, the analog input signal being input into a circuit, the third digital signal being a digital output signal obtained by AD-converting an analog output signal output by the circuit in response to the analog input signal.

* * * * *